United States Patent [19]

Elton et al.

[11] Patent Number: 4,508,055

[45] Date of Patent: Apr. 2, 1985

[54] DEVICE FOR CRYOGENICALLY FABRICATING SOURCE MATERIAL FOR PLASMA X-RAY LASERS

[75] Inventors: Raymond C. Elton, Potomac; Robert H. Dixon, Bowie; James L. Ford, Upper Marlboro, all of Md.

[73] Assignee: The United States of America as represented by the Secretary of the Navy, Washington, D.C.

[21] Appl. No.: 500,725

[22] Filed: Jun. 3, 1983

[51] Int. Cl.³ .............................................. C23C 13/08
[52] U.S. Cl. .................................... 118/724; 118/728; 118/733; 118/50
[58] Field of Search ............... 372/39, 42, 5; 378/119; 118/724, 728, 733, 50; 62/100, 55.5, 268; 417/901; 55/269

[56] References Cited

U.S. PATENT DOCUMENTS

| 3,914,446 | 10/1975 | Ohkuma | 427/101 |
| 4,121,430 | 10/1978 | Bachler et al. | 62/55.5 |
| 4,221,186 | 9/1980 | Woerner | 118/713 |

Primary Examiner—Norman Morgenstern
Assistant Examiner—K. E. Jaconetty
Attorney, Agent, or Firm—Robert F. Beers; William T. Ellis; Alan P. Klein

[57] ABSTRACT

A device for fabricating a target of a lasing material and a pump material for lasing at X-ray wavelengths wherein one of the materials occurs naturally as a gas. A substrate of the other material is cooled below the freezing point of the one material occuring naturally as a gas. Then a gaseous atmosphere of the latter material is supplied to the cooled substrate so that a frozen layer of the latter material condenses onto the substrate to form the target.

11 Claims, 2 Drawing Figures

DEVICE FOR CRYOGENICALLY FABRICATING SOURCE MATERIAL FOR PLASMA X-RAY LASERS

BACKGROUND OF THE INVENTION

The present invention relates generally to coating processes, and more particularly to such processes used for fabricating targets.

The attainment of lasing action at shorter and shorter wavelengths has been an on-going field of research with many anticipated applications.

The traditional laser consists of an active medium pumped in some manner to produce an inverted electron population density between two energy states, and inserted between mirrors which form an optical resonant cavity. A later discovery showed that intense laser emission could be obtained from systems without optical cavities. These highgain mirrorless systems have appropriately termed amplified spontaneous emission (ASE) systems. ASE systems are of major importance in short-wavelength lasers such a X-ray lasers where high reflectivity mirrors do not exist. To produce gain in ASE systems, high inversion densities are called for.

One source given serious consideration for pumping X-ray transitions is laser beams. For example, $Nd^{+3}$ laser beams can be focused to small volumes with high irradiance. However, the photon energy is too small to pump X-ray transitions directly, so the high-power laser pulse must be used to vaporize and heat a pump material to generate plasma X-rays (and charged particles) which in turn fall onto a nearby lasing material and pump the latter's energy levels to inverted populations.

It is of great importance that the plasma X-rays from the pump material be collected efficiently for pumping the lasing material, i.e., over a large, solid angle. Hence the geometry of the target configuration is very important. That is, the thickness and congruency of layered slot targets as well as that of more confined and channeled-plasma targets similar to those described in commonly-assigned U.S. Pat. No. 4,206,364 is most important to maintain.

One promising system of pump material and lasing material under study is the neon-sodium system in which the Na X $1s^2\, ^1S - 1s\, 2p\, ^1P$ line at 11.00 Angstroms is used to optically pump the Ne IX $1s^2\, ^1S - 1s\, 4p\, ^1P$ line at 11.001 Angstroms creating an inversion primarly in the $n=4$, 3 and $n=3$, 2 level pairs of Ne IX, and stimulated emission at 230 and 82 Angstroms, respectively.

Sodium occurs naturally as a solid, but neon occurs naturally as a gas, making it difficult to fabricate the two materials in a controlled fashion into a target for plasma laser production.

SUMMARY OF THE INVENTION

It is therefore an object of the invention to fabricate a target of a pump material and a lasing material for lasing at X-ray wavelengths, where one of the materials is normally-gaseous.

Another object is to form thin layers of a lasing material on a pump material in a controlled fashion and in an environment suitable for plasma production.

These and other objects of the invention are achieved by a device for fabricating a target of a pump material and a lasing material for lasing at X-ray wavelengths, wherein one of the materials is normally-solid and the other material is normally-gaseous. The device includes cooling means to cool a substrate of the normally-solid material below the freezing point of the normally-gaseous material, and supply means to supply a gaseous atmosphere of the latter material to the cooled substrate so that a frozen layer of the normally-gaseous material condenses onto the substrate to form the combination target.

In another aspect, the invention involves a target formed in accordance with this process.

Additional advantages and features will become apparent as the subject invention becomes better understood by reference to the following detailed description when considered in conjunction with the accompanying drawings wherein:

DESCRIPTION OF THE PREFERRED EMBODIMENT

Figure 1:
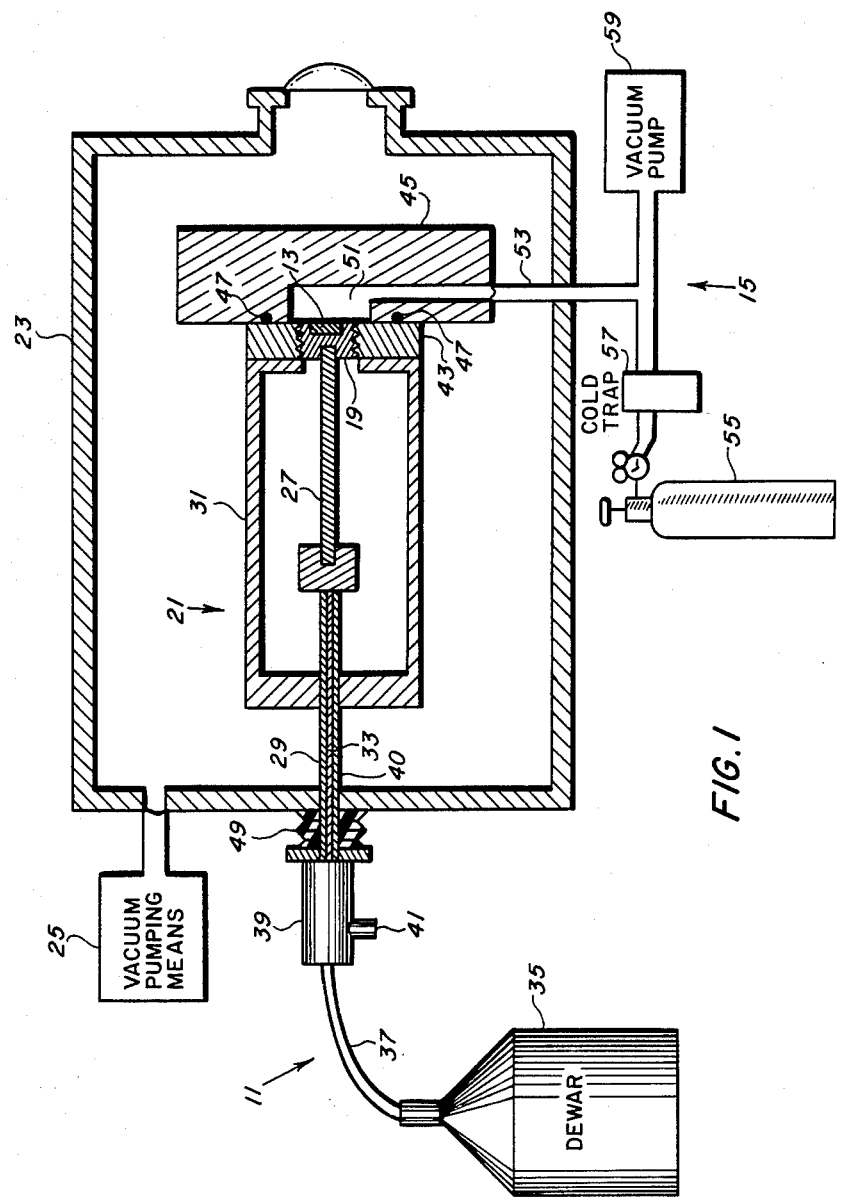
FIG. 1 is a schematic cross-sectional view of the device of the invention before layered target formation.

FIG. 1 shows the device for fabricating a target of a pump material and a lasing material for lasing at X-ray wavelengths, wherein one of the materials (which may be, for example, sodium, aluminum, copper or lead) is normally-solid, and the other material (which may be, for example, neon) is normally-gaseous. The device includes a cooling-means 11 which is employed to cool a substrate 13 of the normally-solid material below the freezing point of the normally-gaseous material, and a supply-means 15 which is employed to supply a gaseous atmosphere of the normally-gaseous material to the cooled substrate 13 so that a frozen layer 17 (shown in FIG. 2) condenses onto the substrate to form the target.

While the cooling-means 11 may take a variety of forms, conveniently it may take the form shown in FIG. 1 of a thermally-conducting block 19 having a top face that includes a recess for mounting the substrate 13 of the normally-solid material, and a cryostat 21 connected to the bottom face of the block 19. The cryostat 21 may comprise, for example, a housing 23 surrounding the block 19, vacuum pumping means 25 communicating with the housing 23, a thermally-conducting rod 27 disposed inside the housing and connected to the bottom face of the block, a cold-finger 29 passing through the housing by way of a vacuum seal and connected to the rod, and a radiation shield 31 connected to the cold-finger and surrounding the rod and part of the cold-finger. The cold-finger 29 has a central channel 33 adapted to receive a coolant, such as liquid helium from a dewar 35 disposed outside the housing 23 by way of a transfer line 37 and a connector 39, and an outer channel 40 adapted for exhausting the evaporated coolant through an outlet 41 in the connector 39. The vacuum pumping means 25 may comprise, for example, a turbo-pump to pump the housing to a low vacuum, and a cryogenic vacuum pump to selectively remove impurity vapors (such as nitrogen, oxygen and water vapor) from the housing while permitting the normally-gaseous material to remain for purging and coating the substrate. The impurities could otherwise form a shielding layer over the target and absorb the laser energy that is focused on the target.

While the supply means 15 may take a variety of forms, conveniently it may take the form shown in FIG. 1 of a thermally-insulating jacket 43 (of lucite, for example) sealingly enclosing the side wall of the block 19 and fitted against the radiation shield 31 of the cryostat 21, a removable thermally-insulating cap 45 sealingly engaging the top face of the jacket, by an "O" ring 47, for example, to cap the top face of the block, and a cap-remover 49. The cap 45 has a hole 51 adapted to coincide with the mounted substrate 13 and to communicate by way of a bifurcated tube 53 with an external pressurized source 55 of the normally-gaseous material preceded by a cold trap 57 of liquid nitrogen, for example, and with another vacuum pump 59. The cap remover 49 may comprise, for example, a normally expanded bellows connected at one end to the cold-finger 29 and at its other end to the housing 23.

In operation, the bellows 49 is normally expanded so that the block 19 and the jacket 43 are retracted from the cap 45. The substrate 13 of the normally-solid material is mounted in the recess in the top face of the block 19. Next, the bellows 49 is contracted to sealingly engage the top of the jacket 43 with the cap 45 to cap the top face of the block 19. Sealing the cap 45 to the thermally-insulated jacket 43 instead of to the block 19 advantageously prevents a possible frozen contact between the cap and the block after the frozen layer of the normally-gaseous material is formed on the substrate 13. The block 19 is then cooled and maintained at a temperature (8° K. absolute for neon, for example) below the freezing point of the normally-gaseous material by evacuating the housing 23 with the vacuum pump 25, and transmitting liquid helium from the dewar 35 by way of the transfer line 37 and connector 39 through the central channel 33 of the cold-finger 29. Next, the normally-gaseous material is supplied to the mounted substrate 13 through the hole 51 in the cap 45 from the pressurized source 55 through the cold trap 57 that pre-cools the gas. The pressure of the source may be 1.5 atmospheres for neon, for example. Confinement of the high pressure gas to the cap region prevents warming of the other cryogenic surfaces by conduction and convection from the walls through the gas. A pool of the gas liquifies on the substrate 13 acting to locally cool the gas further so that a frozen layer of the gas condenses onto the substrate. After the frozen layer is formed, the remaining gas is pumped from the hole 51 with the vacuum pump 59. Finally, to expose the target, the bellows 49 is expanded to retract the top face of the block 19 from the cap 45 and the cap is moved away from in front of the target by positioning means not shown.

Figure 2:
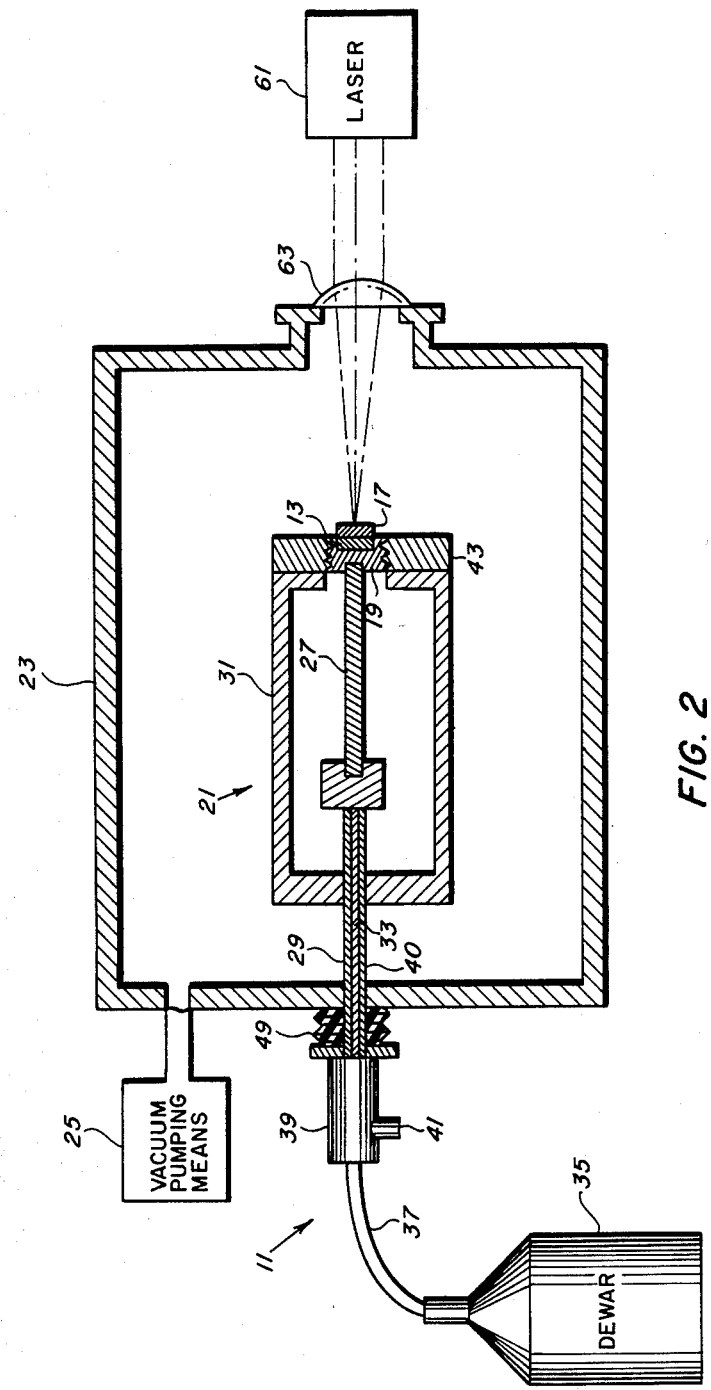
FIG. 2 is a schematic cross-sectional view of the device of the invention after layered target formation.

Referring to FIG. 2, wherein like reference numerals designate elements identical to those shown in FIG. 1, the target 13,17 thus formed can be utilized in place with an external laser 61 focussed on the target by means of a lens 63 disposed in the wall of the housing 23 opposite the target.

It is obvious that many modifications and variations of the present invention are possible in light of the above teachings. For example, in addition to simple layered targets, channeled slab targets such as described in commonly-assigned U.S. Pat. No. 4,206,364, and linear targets in the form of fibers or needles, can be prepared and/or coated cryogenically using the above process. Another alternative is a channeled slab target wherein a series of micro-grooves is formed across the channel so that the channel resembles a "scratch" across a grooved phonograph record. The plasma formed in such a target would be channeled into a linear array of ions cumulated axially as well as transversely by the microgrooves in a corrugated surface arrangement. Also, the plasma can be formed by electrical discharge instead of with an external laser. It is therefore to be understood that within the scope of the appended claims, the invention may be practiced otherwise than as described.

What is claimed as new and desired to be secured by Letters Patent of the United States is:

1. A device for fabricating a target of a pump material and a lasing material for lasing at X-ray wavelengths, wherein one of the materials is normally solid and the other material is normally gaseous, comprising:

cooling means for cooling a substrate of the normally-solid material below the freezing point of the normally-gaseous material, including a thermally conducting block having a bottom face, a side wall, and a top face, the top face including a recess for mounting a substrate of the normally solid material; and supply means for supplying a continual source of gaseous atmosphere of the normally-gaseous material to the cooled substrate so that a frozen layer of the normally gaseous material condenses onto the substrate to form the target.

2. The device recited in claim 1 wherein the cooling means includes:

a cryostat connected to the bottom face of the block for maintaining the block at a temperature below the freezing point of the normally-gaseous material.

3. The device recited in claim 2 wherein the supply means includes:

a thermally-insulating jacket sealingly enclosing the side wall of the block.

4. A device for fabricating a target of a pump material and a lasing material for lasing at X-ray wavelengths, wherein one of the materials is normally solid and the other material is normally gaseous, comprising:

cooling means, for cooling a substrate of the normally-solid material below the freezing point of the normally-gaseous material, including a thermally-conducting block having a bottom face, a side wall and a top face, the top face including a recess for mounting a substrate of the normally-solid material, and a cryostat connected to the bottom face of the block for maintaining the block at a temperature below the freezing point of the normally-gaseous material; and supply means, for supplying a gaseous atmosphere of the normally-gaseous material to the cooled substrate so that a frozen layer of the normally-gaseous material condenses onto the substrate to form the target, including a thermally-insulating jacket sealingly enclosing the side wall of the block and a removable thermally-insulating cap sealingly engaging the top of the jacket to cap the top face of the block, the cap having a hole adapted to coincide with the mounted substrate and to communicate with an external pressurized supply of the normally-gaseous material and also with an external vacuum pump.

5. A device for fabricating a target of a pump material and a lasing material for lasing at X-ray wavelengths, wherein one of the materials is normally solid and the other material is normally gaseous, comprising:

a thermally-conducting block having a bottom face, a side wall, and a top face, the top face including a recess for mounting a substrate of the normally-solid material;

a cryostat connected to the bottom face of the block for maintaining the block at a temperature below the freezing point of the normally-gaseous material to cool the substrate below the freezing point of the normally-gaseous material;

a thermally-insulating jacket sealingly enclosing the side wall of the block;

a removable thermally-insulating cap sealingly engaging the top of the jacket to cap the top face of the block, the cap having a hole adapted to coincide with the mounted substrate and to communicate with an external pressurized supply of the normally-gaseous material and also with an external vacuum pump to supply a gaseous atmosphere of the normally-gaseous material to the cooled substrate so that a frozen layer of the normally-gaseous material condenses onto the substrate to form the target; and a cap-remover.

6. The device recited in claim 5 wherein the cryostat includes:

a housing surrounding the block.

7. The device recited in claim 6 wherein the cryostat includes:

external vacuum pumping means communicating with the housing.

8. The device recited in claim 7 wherein the cryostat includes:

a thermally-conducting rod disposed inside the housing and connected to the bottom face of the block.

9. The device recited in claim 8 wherein the cryostat includes:

a cold-finger passing through the housing and connected to the rod, the cold finger having a central channel adapted to receive a coolant and an outer channel adapted for exhausting the evaporated coolant.

10. The device recited in claim 8 wherein the cryostat includes:

a radiation shield connected to the cold-finger and surrounding the rod and part of the cold-finger.

11. A device for fabricating a target of a pump material and a lasing material for lasing at X-ray wavelengths, wherein one of the materials is normally solid and the other material is normally gaseous, comprising:

a thermally-conducting block having a bottom face, a side wall, and a top face, the top face including a recess for mounting a substrate of the normally-solid material;

a housing surrounding the block;

external vacuum pumping means communicating with the housing;

a thermally-conducting rod disposed inside the housing and connected to the bottom face of the block;

a cold-finger passing through the housing and connected to the rod for maintaining the block at a temperature below the freezing point of the normally-gaseous material to cool the substrate below the freezing point of the normally gaseous material, the cold-finger having a central channel adapted to receive a coolant and an outer channel adapted for exhausting the evaporated coolant;

a radiation shield connected to the cold-finger and surrounding the rod and part of the cold-finger;

a thermally-insulating jacket sealingly enclosing the side wall of the block;

a removable thermally-insulating cap sealingly engaging the top of the jacket to cap the top face of the block, the cap having a hole adapted to coincide with the mounted substrate and to communicate with an external pressurized supply of the normally-gaseous material and also with an external vacuum pump to supply a gaseous atmosphere of the normally-gaseous material to the cooled substrate so that a frozen layer of the normally gaseous material condenses onto the substrate to form the target; and a normally-expanded bellows having one end connected to the cold-finger and another end connected to the housing for removing the cap.

* * * * *